United States Patent [19]

Dotter, Jr.

[11] Patent Number: 4,780,896
[45] Date of Patent: Oct. 25, 1988

[54] HIGH SPEED DIGITAL COUNTER SLIP CONTROL CIRCUIT

[75] Inventor: Berton E. Dotter, Jr., Albuquerque, N. Mex.

[73] Assignee: Siemens Transmission Systems, Inc., Phoenix, Ariz.

[21] Appl. No.: 12,513

[22] Filed: Feb. 9, 1987

[51] Int. Cl.⁴ .................... H03K 21/40; H03K 23/40; H03L 7/00
[52] U.S. Cl. ...................................... 377/50; 377/47; 377/114
[58] Field of Search .................... 377/72, 73, 28, 114, 377/47, 50, 107, 108, 124, 46

[56] References Cited

U.S. PATENT DOCUMENTS

| | | | |
|---|---|---|---|
| 3,571,794 | 3/1971 | Tong | 371/42 |
| 3,618,036 | 11/1971 | Carbrey | 364/900 |
| 3,673,501 | 6/1972 | Zeph | 377/72 |
| 3,800,233 | 3/1974 | Sauthier | 377/50 |
| 3,867,579 | 2/1975 | Colton et al. | 370/102 |
| 4,101,838 | 7/1978 | Aihara et al. | 377/50 |
| 4,175,287 | 11/1979 | Fuhrman | 364/900 |
| 4,184,068 | 1/1980 | Washburn | 377/47 |
| 4,368,531 | 1/1983 | Chopping | 370/100 |
| 4,394,769 | 7/1983 | Lull | 377/122 |
| 4,561,250 | 5/1985 | Grimes | 375/82 |
| 4,573,175 | 7/1986 | Cressey et al. | 377/50 |
| 4,580,279 | 4/1986 | Kahn | 375/118 |

FOREIGN PATENT DOCUMENTS 0156213 10/1985 European Pat. Off. .

OTHER PUBLICATIONS

Author: Floyd M. Gardner; title: A Cycle-Slip Detector for Phase-Locked Demodulators, dated 9/77; pp. 251–254, IEEE Transactions, vol. IM-26, No. 3.

Primary Examiner—John S. Heyman
Attorney, Agent, or Firm—David N. Caracappa; Jeffrey P. Morris

[57] ABSTRACT

A counter slip control circuit is described for digital transmission systems wherein the counter uses a feedback circuit to define the permissible counter states. The slip control input modifies the feedback function so that certain counter states are either repeated or skipped. A repeated counter state is equivalent to retardation of the counter output signal phase. A skipped counter state is equivalent to advancing the counter output signal phase. The slip control gate is eliminated from the clock input line to the counter and instead is included in the feedback path which eliminates the skew problem and permits the equivalent of adding clock pulses without the requirement for logic speeds of twice the normal clock speed.

8 Claims, 3 Drawing Sheets

HIGH SPEED DIGITAL COUNTER SLIP CONTROL CIRCUIT

BACKGROUND OF THE INVENTION

1. Field of the Invention

The present invention relates generally to digital transmission in which synchronization is provided by a clock to properly identify and recover a digital signal at a receiving terminal. More specifically, the present invention relates to a digital slip control circuit for either advancing or retarding the timing of the output signal phase of a digital counter without degrading timing performance in high speed applications. The counter slip control technique of the present invention is particularly advantageously applicable to digital phase lock loop circuits, to telecommunications frame synchronization circuits, to high speed elastic buffers, to bit stuffing control counters, to high speed demultiplexers and to channel decoding counter circuits.

2. Description of the Prior Art

Digital signal transmission systems are generally synchronized by means of digital clock signals. Since the digital transmission signals generally include both data (payload) and control (overhead) bits, several frequencies as well as phases of the clock signal are required to completely identify the entire content of the digital transmission signals. Adjustment of a digital counter with a slip control means is well known in the prior art to provide timing signals having various required phases to decompose and identify the contents of a digital signal. As aforementioned, counter slip control is the technique by which a counter output is either advanced or retarded in phase in response to a slip control input pulse.

It is known in the prior art that the counter output phase can be retarded by subtracting a clock pulse and can be advanced by adding a clock pulse. In such known techniques, clock pulses are either added or subtracted by means of a logic gate in series with the clock input to the counter. In high speed counter applications, such prior art techniques are inadequate since the addition of a gate in series with the clock line increases the delay in the timing path, resulting in skew in the timing signals derived at the counter output. Additionally, if clock pulses are added, the gate and the counter are required to operate at twice the normal clock rate, at least momentarily. In high speed logic applications in which the counter is already running at or near the maximum toggle rate, the counter could not operate at the doubled frequency, hence it would be impossible to add a clock pulse.

The present invention avoids the aforementioned deficiencies of the prior art by providing a slip control circuit that does not introduce timing skew in the timing signals derived at the counter output. Also in accordance with the present invention, counter slip control, either phase advancement or phase retardation, can be achieved notwithstanding that the counter is operating at or near its maximum toggle rate of its technology.

SUMMARY OF THE INVENTION

A counter slip control is described wherein the counter uses a feedback circuit to define the permissible counter states. The slip control input modifies the feedback function so that certain counter states are either repeated or skipped. A repeated counter state is equivalent to retardation of the counter output signal phase. A skipped counter state is equivalent to advancing the counter output signal phase. The slip control gate is eliminated from the clock input line to the counter and instead is included in the feedback path which eliminates the skew problem and permits the equivalent of adding clock pulses without the requirement for logic speeds of twice the normal clock speed. With proper timing of the slip control event, the equivalent of adding a clock pulse for counter phase advancement is implemented without the clock rate doubling effect.

It is therefore a primary object of the invention to provide a slip control feedback circuit which utilizes counter timing to control critical timing of the slip control event.

It is another object of the invention to provide a counter slip control circuit for phase retardation of a counter output signal.

It is yet another object of the invention to provide a counter slip control circuit for phase advancement of a counter output signal.

Other objects and advantages of the invention will become apparent with reference to the accompanying drawings wherein:

DESCRIPTION OF THE PREFERRED EMBODIMENTS

Figure 1A:
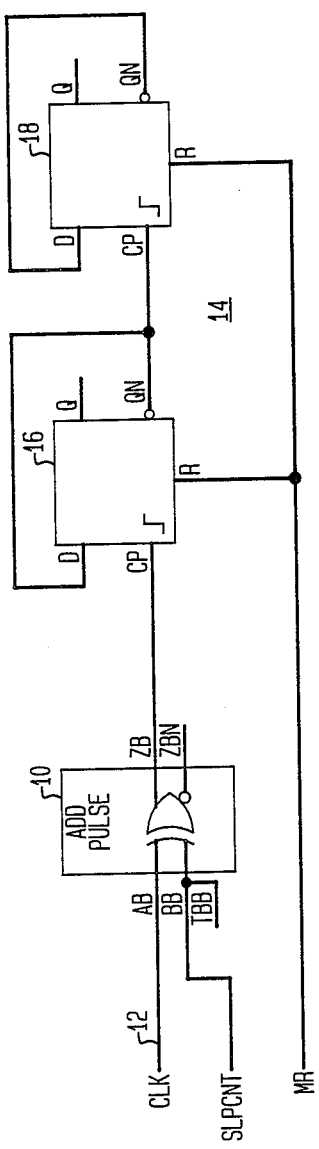
FIGS. 1(a) and 1(b) are slip control circuits illustrative of the prior art.

FIG. 1 (a) illustrates a slip control circuit of the prior art in which slip control is achieved by pulsing a gate 10 in series with the clock input line 12 which is in series with a digital counter 14, which is shown as a two-stage counter comprised of flip-flop circuits 16 and 18. When a pulse is to be added, the slip control exclusive Or gate 10 and the first counter stage, flip-flop 16, must be capable of operating at twice the normal clock rate. If the logic is already operating at its maximum toggle rate, it would not be possible to use the slip control circuit of FIG. 1(a) which requires adding a pulse.

Figure 1B:
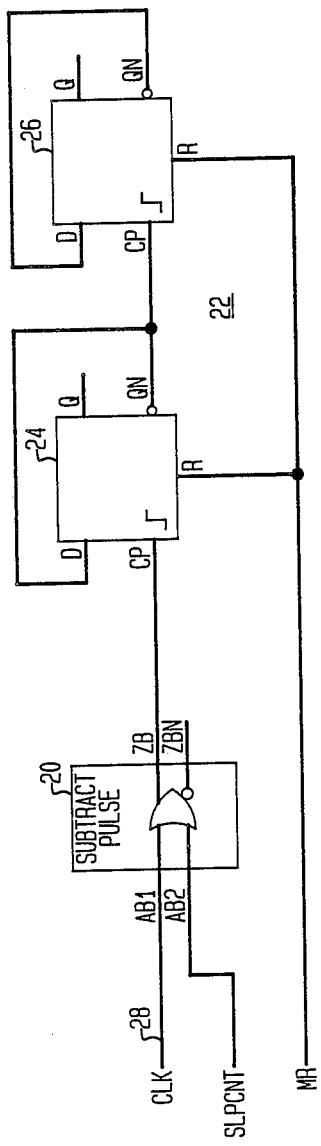

FIG. 1(b) illustrates the same slip control circuit technique of the prior art as described with reference to FIG. 1(a), in which a gate 20 is in series with a counter 22. The counter 22 consists of two-stages of flip-flops, 24 and 26. The gate 20 in this example is an Or gate for subtraction of a pulse, and is in series in the clock input line 28 with the counter 22. The logic inputs of the gates 10 and 20 are as indicated.

Figure 2:
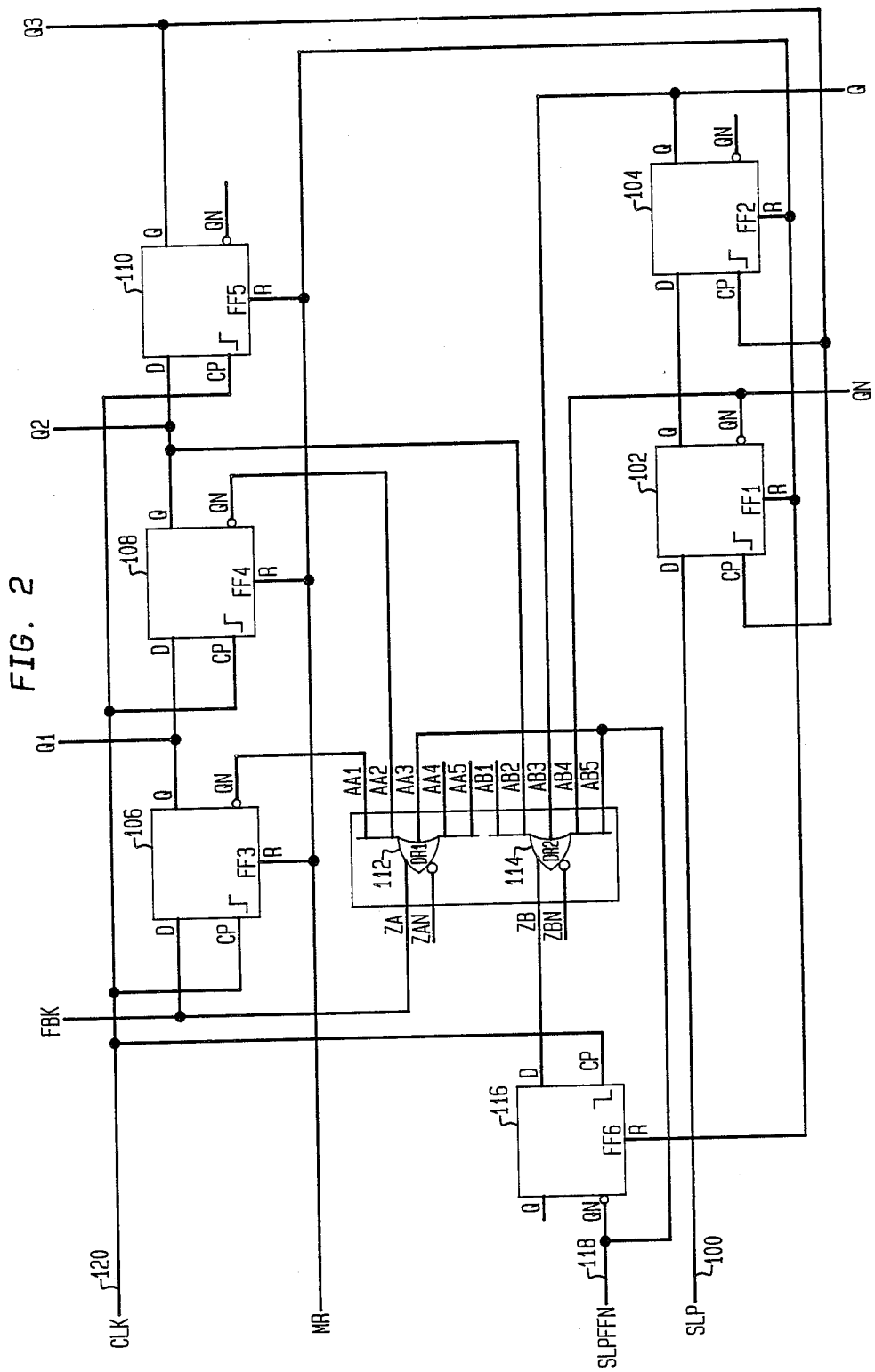
FIG. 2 is a circuit diagram of a slip control circuit of the present invention wherein signal phase retardation is implemented.
Figure 3:
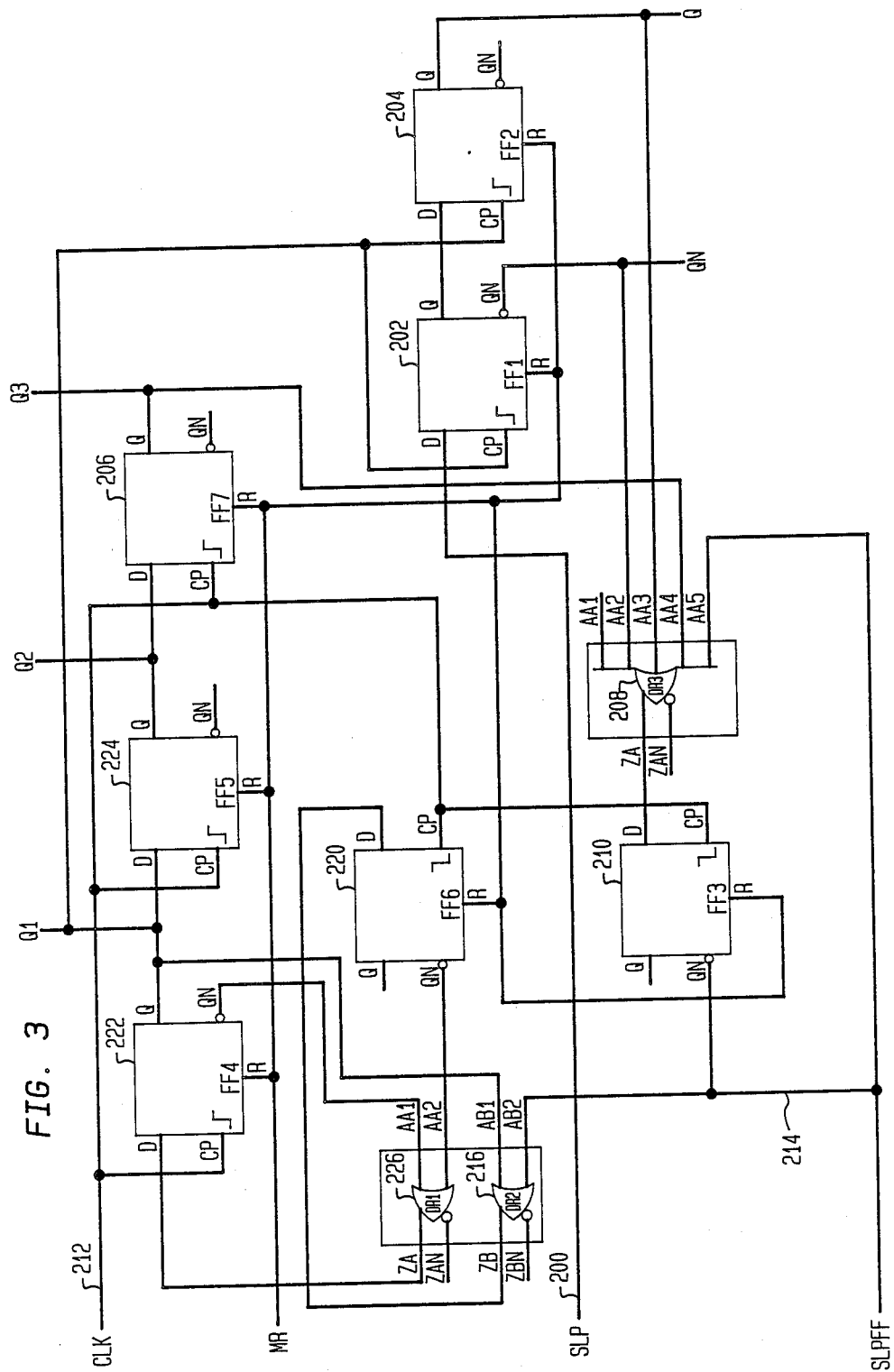
FIG. 3 is a circuit diagram of another embodiment of the present invention wherein signal phase advancement is implemented.

Referring now to FIGS. 2 and 3, embodiments of the present invention are illustrated which, unlike the prior art slip control circuitry described with reference to FIGS. 1(a) and 1(b), do not have a gate in series with the clock line to the counter. The invention, described hereinafter with reference to FIGS. 2 and 3, effectively eliminates skew in the clock signal to the counter. Slip control is accomplished in a feedback circuit which forces desired counter logic states to exist. When a slip control input pulse is applied to the slip control input line, a flip-flop stores this information and modifies the counter feedback control to cause a slip control event to take place with non-critical timing, such that slip control events always take place at logic rates below he critical rate of the logic circuit.

A slip control circuit of the invention is shown in FIG. 2 in which a clock pulse is subtracted and hence phase retardation of the counter output is achieved. A slip control pulse in the form of a logic high on line 100 is applied to a two stage shift register comprised of flip-flops 102 and 104. A digital counter is comprised of a three stage ring counter configured from flip-flops 106, 108, and 110, having a feedback loop through Or gate 112. When the shift register loads in the slip control pulse on line 100, the slip control event occurs by enabling Or gate 114 of the dual Or gate and which resets flip-flop 116 on the next clock pulse. The output of flip-flop 116 on line 118 is applied to an input to Or gate 112 and modifies the feedback of the ring counter. This feedback modification results in a repeated counter state, thereby retarding the counter phase by the equivalent of one clock time period. This repetition of a counter state is equivalent to subtracting a clock pulse from the clock line 120 to the ring counter. The aforedescribed slip control event occurs without any gate in series with the clock line 120 to the ring counter. Additionally, this slip control event occurs at the lower logic operating speed of the Or gate 112, the feedback circuit.

Referring now to FIG. 3, a slip control circuit in accordance with the invention is described in which the slip control event is equivalent to adding a clock pulse and hence phase advancement of the counter output is achieved. A slip control input pulse in the form of a logic high on line 200 is loaded into a two stage shift register comprised of flip-flops 202 and 204, which together with flip-flop 206 enables Or gate 208 to reset flip-flop 210 on the next clock pulse on line 212. The output of flip-flop 210 on line 214 is coupled to Or gate 216, and the output of Or gate 216 on line 218 sets flip-flop 220 on the next clock pulse, thereby modifying the feedback path through Or gate 226 to the three stage ring counter, which ring counter is comprised of flip-flops 222, 224 and 206. This feedback modification causes the ring counter to skip one state, hence advancing the counter output phase. The enable timing for Or gate 208 is provided by flip-flop 206 to establish the critical timing for the slip control event such that the skipped counter state is caused to occur at the proper time in the sequence of the ring counter.

Or gates 112 and 114 described with reference to FIG. 2 and Or gates 216 and 226 described with reference to FIG. 3 are illustrated as implemented in dual Or gate circuit configuration, and are available as off-the-shelf components, as are the various flip-flops.

I claim:

1. A counter slip control circuit for high speed digital logic, comprising:
   digital counter means for deriving an output signal and having a plurality of counter states and having a clock input;
   counter feedback circuit means for forcing desired counter states to occur at desired times in synchronism with a signal at said clock input; slip control input means for receiving a slip control input pulse; and
   feedback modification circuit means responsive to the slip control input means, and having an output coupled to said counter feedback circuit means, such that a counter state is repeated, thereby retarding the phase of the counter output signal.

2. A counter slip control circuit in accordance with claim 1, wherein said retarding is equivalent to one clock time period.

3. A counter slip control circuit in accordance with claim 1, wherein the digital counter is a ring counter.

4. A counter slip control circuit in accordance with claim 3 wherein said ring counter comprises a plurality of stages, each stage consisting of a flip-flop circuit.

5. A counter slip control circuit for high speed digital logic, comprising:
   digital counter means for deriving an output signal and having a plurality of counter states and having a clock input;
   counter feedback circuit means for forcing desired counter states to occur at desired times in synchronism with a signal at said clock input;
   slip control input means for receiving a slip control input pulse; and
   feedback modification circuit means responsive to the slip control input means and having an output coupled to said counter feedback circuit means, such that a counter state is skipped, thereby advancing the phase of the counter output signal.

6. A counter slip control circuit in accordance with claim 5, wherein the digital counter is a ring counter.

7. A counter slip control circuit in accordance with claim 6, wherein said ring counter comprises a plurality of stages, each stage consisting of a flip-flop circuit.

8. A counter slip control circuit in accordance with claim 5 wherein said feedback modification circuit includes means for defining the permissible counter states

* * * * *